United States Patent
Brenninger et al.

(10) Patent No.: US 9,828,692 B2
(45) Date of Patent: Nov. 28, 2017

(54) APPARATUS AND PROCESS FOR PRODUCING A SINGLE CRYSTAL OF SILICON

(71) Applicant: SILTRONIC AG, Munich (DE)

(72) Inventors: Georg Brenninger, Oberbergkirchen (DE); Waldemar Stein, Burghausen (DE); Maik Haeberlen, Burghausen (DE)

(73) Assignee: SILTRONIC AG, Munich (DE)

( * ) Notice: Subject to any disclaimer, the term of this patent is extended or adjusted under 35 U.S.C. 154(b) by 132 days.

(21) Appl. No.: 14/670,477

(22) Filed: Mar. 27, 2015

(65) Prior Publication Data

US 2015/0292109 A1   Oct. 15, 2015

(30) Foreign Application Priority Data

Apr. 14, 2014   (DE) .................. 10 2014 207 149

(51) Int. Cl.
| | | |
|---|---|---|
| *C30B 13/08* | (2006.01) | |
| *C30B 11/10* | (2006.01) | |
| *C30B 11/00* | (2006.01) | |
| *C30B 29/06* | (2006.01) | |
| *C30B 15/12* | (2006.01) | |
| *C30B 15/02* | (2006.01) | |
| *C30B 13/14* | (2006.01) | |
| *C30B 13/20* | (2006.01) | |

(52) U.S. Cl.
CPC ............ *C30B 11/10* (2013.01); *C30B 11/001* (2013.01); *C30B 11/003* (2013.01); *C30B 13/08* (2013.01); *C30B 13/14* (2013.01); *C30B 13/20* (2013.01); *C30B 15/02* (2013.01); *C30B 15/12* (2013.01); *C30B 29/06* (2013.01)

(58) Field of Classification Search
CPC ....... C30B 29/06; C30B 13/08; C30B 11/001; C30B 13/14; C30B 15/02; C30B 15/12
See application file for complete search history.

(56) References Cited

U.S. PATENT DOCUMENTS

| | | | |
|---|---|---|---|
| 2003/0145781 A1* | 8/2003 | Von Ammon | .......... C30B 13/08 117/49 |
| 2005/0188918 A1 | 9/2005 | Abrosimov et al. | |
| 2011/0095018 A1 | 4/2011 | von Ammon et al. | |
| 2011/0185963 A1 | 8/2011 | Von Ammon et al. | |

FOREIGN PATENT DOCUMENTS

| | | |
|---|---|---|
| EP | 2319961 A1 | 5/2011 |
| JP | H0-9142988 A | 6/1997 |
| JP | 2005-529046 A | 9/2005 |
| WO | 2013064626 A1 | 5/2013 |

* cited by examiner

*Primary Examiner* — Matthew Song
(74) *Attorney, Agent, or Firm* — Brooks Kushman P.C.

(57) ABSTRACT

An apparatus for producing a single crystal of silicon comprises a plate with a top side, an outer edge, and an inner edge, a central opening adjoining the inner edge, and a tube extending from the central opening to beneath the bottom side of the plate;
  a device for metering granular silicon onto the plate;
  a first induction heating coil above the plate, provided for melting of the granular silicon deposited;
  a second induction heating coil positioned beneath the plate, provided for stabilization of a melt of silicon, the melt being present upon a growing single crystal of silicon. The top side of the plate consists of ceramic material and has elevations, the distance between the elevations in a radial direction being not less than 2 mm and not more than 15 mm.

12 Claims, 1 Drawing Sheet

APPARATUS AND PROCESS FOR PRODUCING A SINGLE CRYSTAL OF SILICON

CROSS-REFERENCE TO RELATED APPLICATIONS

This application claims priority to German Patent Application No. DE 102014207149.6 filed Apr. 14, 2014 which is herein incorporated by reference.

BACKGROUND OF THE INVENTION

1. Field of the Invention

The invention provides an apparatus and a process for producing a single crystal of silicon, in which granular silicon is used as the raw material, and is processed to produce the single crystal. The apparatus comprises a plate having a central opening and a tube directed downward from the central opening, a device for metering the granular silicon onto the plate, a first induction heating coil arranged above the plate and a second induction heating coil arranged beneath the plate.

2. Description of the Related Art

U.S. 2003145781 A1 and U.S. 2011185963 A1 describe apparatuses having the features mentioned, and also processes for producing a single crystal using such apparatuses. The lower end of the downwardly directed tube is closed with solid silicon at first, and the tube is heated with the aid of the second induction heating coil, in order that liquid silicon forms at the lower end of the closed tube. Subsequently, a monocrystalline seed crystal is contacted with the liquid silicon, rotated and lowered and, at the same time, further silicon is melted from the lower end of the tube. When the seed crystal is lowered, liquid silicon crystallizes on the seed crystal. After a phase which is called necking, which serves the purpose of passing dislocations out of the crystallized part to the surface thereof, a growing single crystal is finally present. At the top end of the growing crystal, there is a small volume of a melt of silicon which supports the further growth of the single crystal. The volume of the melt and the diameter of the growing single crystal are increased constantly during a further phase until a target diameter has been attained. Thereafter, the single crystal is allowed to grow in an approximately cylindrical manner, in order to further process the part which has grown cylindrically to give semiconductor wafers at a later stage. After the solid silicon which closed the lower end of the tube has melted, further liquid silicon which is required for growth of the single crystal is provided. For this purpose, granular silicon is deposited on the plate and melted with the aid of the first induction heating coil, while rotating the plate. The silicon flows as liquid silicon from the top side of the plate to the central opening in the plate and through the tube to the melt atop the growing single crystal.

U.S. 2003145781 A1 proposes using a vessel made of quartz or a plate made of silicon as the plate, providing elevations on the top side of the plate which form passages in order to extend the flow path for the melting silicon to the central opening. The extension of the flow path is supposed to promote complete melting of solid silicon originating from the granular silicon before it arrives at the growing single crystal. If there are to be no such passages, it is proposed that a barrier of solid silicon be set up on the top side of the plate in the region of the central opening by the action of the first induction heating coil. The height of the barrier is chosen such that granular silicon cannot get over the barrier unless it has melted completely.

The inventors of the present invention have found that the top side of a plate made of silicon is altered by the action of the first induction heating coil to such an extent that the use of the plate for production of a further single crystal is not an option, or is possible only after extensive reconditioning. In addition, it was found that when a plate made of quartz is used, the transport of liquid silicon from the region of the outer edge of the top side to the inner edge of the top side is impaired even when there are no passages to extend the flow path.

SUMMARY OF THE INVENTION

It is an object of the present invention to enable simple reusability of the plate and to facilitate the transport of liquid silicon from the outer edge of the top side of the plate to the inner edge of the top side of the plate. These and other objects have been surprisingly and unexpectedly achieved by use of a plate having a top surface of ceramic material, the top surface containing spaced-apart elevations.

DETAILED DESCRIPTION OF THE PREFERRED EMBODIMENT(S)

Figure 1:
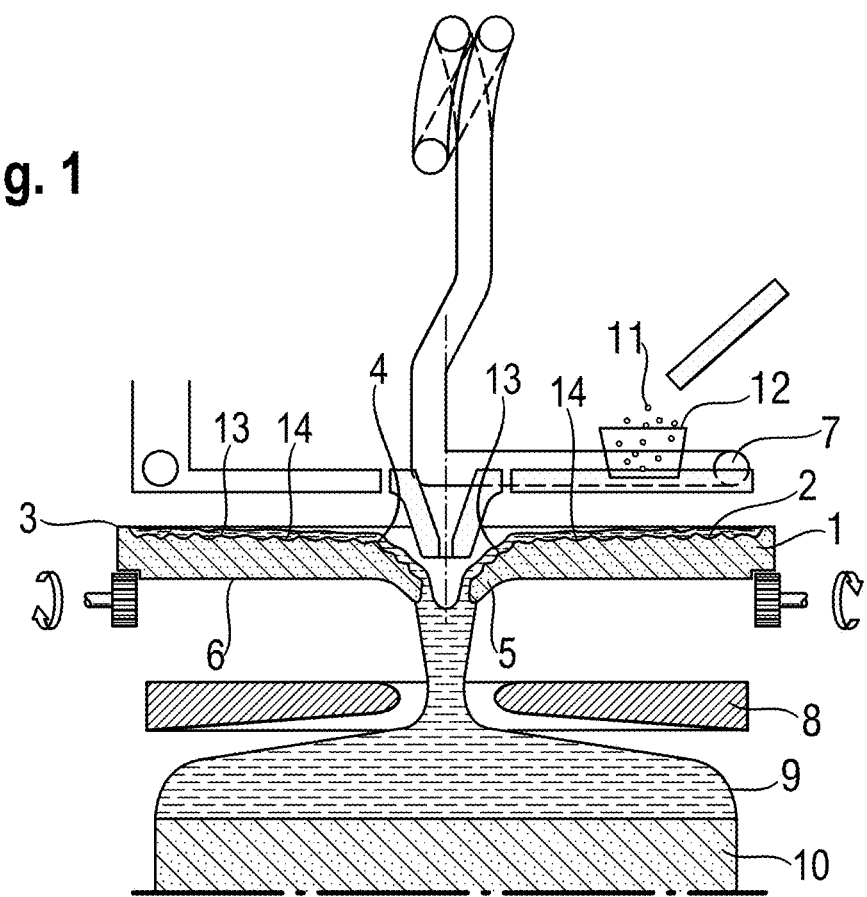
FIG. 1 shows the section view of a particularly preferred embodiment of the inventive apparatus for producing a single crystal of silicon.

The invention is thus directed to an apparatus for producing a single crystal of silicon, comprising:

a plate with a top side having an outer edge and an inner edge, with a central opening adjoining the inner edge, and with a tube which extends from the central opening to beneath a bottom side of the plate;

a device for metering granular silicon onto the top side of the plate;

a first induction heating coil which is arranged above the plate and is configured to melt granular silicon deposited onto the plate;

a second induction heating coil which is arranged beneath the plate which stabilizes a melt of silicon, the melt being present upon a growing single crystal of silicon, wherein the top side of the plate consists of ceramic material and has elevations, the distance between the middles of adjacent elevations in a radial direction being not less than 2 mm and not more than 15 mm.

The invention also provides a process for producing a single crystal of silicon, comprising:

providing the apparatus previously described;

depositing granular silicon on the top side of the plate in the region of the outer edge of the top side while rotating the plate;

melting the granular silicon and passing the molten silicon over the elevations through the central opening in the plate and through the tube until it joins a melt upon a growing single crystal of silicon.

The plate and the tube are preferably made in one piece. The top side of the plate consists of a ceramic material which is thermally stable on contact with liquid silicon and contaminates the liquid silicon with extraneous substances to a minimum degree. The plate and the tube may consist of a base structure coated with the ceramic material. The plate and the tube may also consist entirely of the ceramic material. Possible materials for the base structure are fracture-resistant materials of high thermal stability which can be coated with the ceramic material, for example metals and carbon. Particular preference is given to base structures made from carbon. The ceramic material is preferably a material such as alumina ($Al_2O_3$), boron nitride (BN), lanthanum hexaboride ($LaB_6$), silicon carbide (SiC), silicon nitride ($Si_3N_4$), yttria ($Y_2O_3$), zirconia ($ZrO_2$) or quartz ($SiO_2$). Particular preference is given to silicon carbide.

Because of the elevations, the top side of the plate is not flat but structured. Between the elevations are valleys, preferably closed valleys. Closed valleys are areas on the surface of the plate which are completely surrounded by elevations. Liquid silicon present in one of the valleys forms a lake enclosed by the elevations. Such elevations are distributed between the outer and inner edges of the top side of the plate. The valleys may have an outline which is, for example, annular, square, rectangular, spiral-shaped or rhombus-shaped. There is preferably a gradient between valleys at the outer edge of the plate and valleys radially closer to the central opening in the plate. The gradient has an angle of inclination of preferably not less than 1° and not more than 15°, more preferably not less than 1° and not more than 5°. Liquid silicon therefore has a tendency to flow from the outer edge of the plate to the central opening in the plate.

The inventors have found that the elevations are appropriate in order to facilitate the transport of liquid silicon from the outer edge of the top side of the plate to the inner edge of the top side of the plate. If there are no elevations, the transport of liquid silicon to the central opening is impaired. The reason for this is the moderate wettability of the ceramic material by liquid silicon. On a plate lacking elevations, slow-moving islands of liquid silicon form, which wet the top side of the plate only sparingly and show barely any tendency to flow to the central opening.

The structuring proposed in accordance with the invention on the top side of the plate by elevations results in formation of lakes of liquid silicon in the valleys in the course of melting of the granular silicon deposited. As time goes on, the volume of such lakes increases until the elevations are no longer able to keep liquid silicon in the valleys, and the lakes overflow. The overflowing liquid silicon does not show any tendency to form islands and finally flows over the elevations to the central opening in the plate. In the course of this, overflowing liquid silicon combines and covers a large area of the top side of the plate.

The difference in height between a valley floor and the highest point of an elevation which bounds the valley is preferably not less than 0.1 mm and not more than 5 mm, more preferably not less than 0.5 mm and not more than 3 mm. In order to enable mass transfer of liquid silicon over the elevations, the distance between the middles of adjacent elevations in the radial direction is not less than 2 mm and not more than 15 mm, preferably not less than 3 mm and not more than 6 mm.

The inventive apparatus has the additional advantage that a cooling device can be dispensed with, which would be required in order to cool the plate if it consisted of silicon. The inventive apparatus does not need any such cooling device.

In a particularly preferred embodiment of the invention, the elevations and valleys, when viewed from above, form rings arranged concentrically around the central opening. In addition, the elevations and valleys may also be present on the inner surface of the tube.

The outer edge of the top side of the plate may be surrounded by a wall, and for that reason the plate could be referred to as a dish.

The invention is elucidated hereinafter with reference to figures.

The apparatus according to FIG. 1 comprises a plate 1 with a top side 2 having an outer edge 3 and an inner edge 4. In the middle of the plate are a central opening which adjoins the inner edge, and a tube 5 which extends from the central opening to beneath a bottom side of the plate 6. The apparatus further comprises a first induction heating coil 7 arranged above the plate and a second induction heating coil 8 arranged beneath the plate. The first induction heating coil 7 is used to melt granular silicon, and the lower induction heating coil 8 to stabilize a melt 9 of silicon present upon a growing single crystal 10 of silicon. The granular silicon 11 is applied by means of a metering device 12 through the first induction heating coil 7 to the top side of the plate, for example by scattering. It is preferably supplied in such a way that it first comes into contact with the top side of the plate in an outer region close to the outer edge.

The top side of the plate consists of ceramic material, preferably of silicon carbide, and has elevations 13 which bound closed valleys 14. The elevations 13 and closed valleys 14, when viewed from above, form rings which lie concentrically with respect to the central opening and which extend from the outer edge to the inner edge of the top side of the plate and which are also present on the inner surface of the tube.

Figure 2:
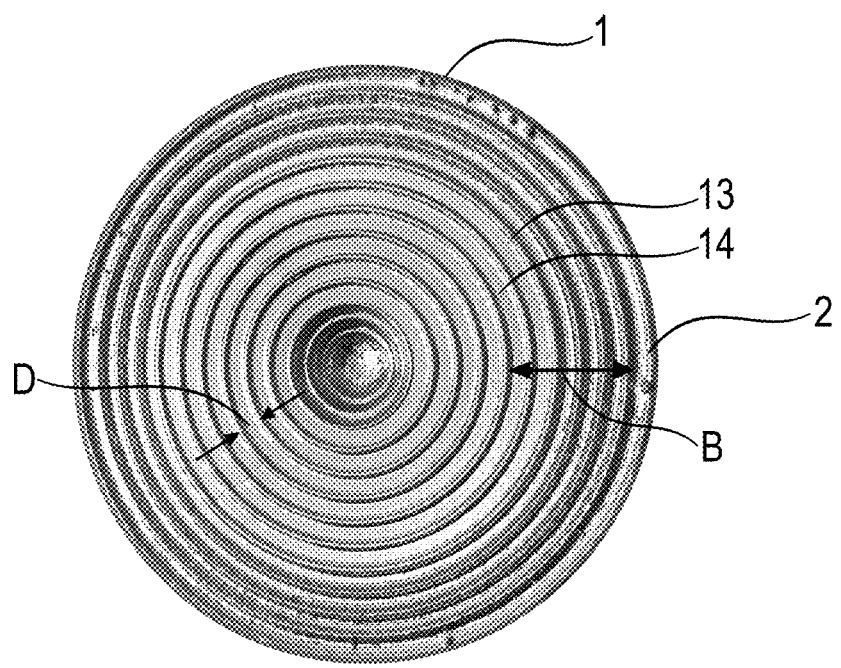
FIG. 2 shows one embodiment of the top surface of a plate (1) of FIG. 1.

FIG. 2 shows the plate 1 with the annular elevations 13 and valleys 14 which are concentric with respect to the central opening, viewed from above. The distance D between the middles of adjacent elevations, in the radial direction, is not less than 2 mm and not more than 15 mm. The region B on the top side 2 of the plate 1 into which the granular silicon is applied has, for example, the radial position and width indicated by the double arrow.

EXAMPLE AND COMPARATIVE EXAMPLE

For production of single crystals of silicon, two different apparatuses were provided. The only difference was that, for production in a noninventive manner, an apparatus having a plate with no elevations on the top side thereof was used. For production in the inventive manner, an inventive apparatus was used, with a plate according to FIG. 2, having concentric annular elevations present on the top side thereof.

It was found that the mass transfer of liquid silicon, when the plate having a smooth unstructured surface was used, was considerably impaired because of the formation of slow-moving islands of liquid silicon. This disadvantage did not occur when the inventive apparatus was used.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A process for producing a single crystal of silicon, comprising:
   providing an apparatus comprising: a plate having an outer edge, an inner edge, and a top side, a central opening adjoining the inner edge, and a tube which extends from the central opening to beneath a bottom side of the plate; a device for depositing granular silicon onto the top side of the plate; a first induction heating coil which is arranged above the plate configured to melt the granular silicon deposited; a second induction heating coil which positioned beneath the plate, configured to stabilize a melt of silicon present upon a growing single crystal of silicon, wherein the top side of the plate consists of ceramic material and has a plurality of elevations rising above a surface of the plate, the distance between the middles of adjacent elevations in a radial direction being not less than 2 mm and not more than 15 mm;

providing a growing single crystal of silicon by crystallizing liquid silicon on a seed crystal; and depositing granular silicon on the top side of the plate proximate the outer edge of the top side, while rotating the plate;

melting the granular silicon and passing the molten silicon over the elevations through the central opening in the plate and through the tube until the molten silicon joins the melt upon the growing single crystal of silicon.

2. A process for producing a single crystal of silicon, as claimed in claim 1, wherein:

the ceramic material is selected from the group consisting of alumina, boron nitride, lanthanum hexaboride, silicon carbide, silicon nitride, tantalum oxide, yttria, zirconia, quartz, and mixtures thereof.

3. A process for producing a single crystal of silicon, as claimed in claim 1, wherein:

the elevations are arranged concentrically about the central opening.

4. A process for producing a single crystal of silicon, as claimed in claim 1, wherein:

the outer edge of the top side of the plate is surrounded by a wall.

5. The process of claim 1, wherein the plurality of elevations is in the form of a spiral.

6. The process of claim 1, wherein the plurality of elevations is in the form of concentric circles.

7. The process of claim 1, wherein closed valleys are located between successive elevations.

8. The process of claim 1, wherein valleys located between adjacent elevations exhibit a downward gradient between valleys located more close to the central opening relative to valleys located further away from the central opening.

9. The process of claim 8, wherein the gradient has an angle of from 1° to 15° from horizontal.

10. The process of claim 1, wherein valleys are located between adjacent elevations, with a height from the bottom of a valley to the highest point of an elevation bounding the valley is from 0.1 mm to 5 mm.

11. The process of claim 1, wherein valleys are located between adjacent elevations, with a height from the bottom of a valley to the highest point of an elevation bounding the valley is from 0.5 mm to 3 mm.

12. The process of claim 1, wherein the elevations and valleys are present on an inner surface of the tube.

* * * * *